United States Patent
Martini et al.

(10) Patent No.: US 9,666,751 B2
(45) Date of Patent: May 30, 2017

(54) METHOD FOR PRODUCING AN ELECTRICALLY CONDUCTIVE CONTACT ON A SOLAR CELL

(71) Applicant: Fraunhofer-Gesellschaft zur Förderung der angewandten Forschung e.V., Munich (DE)

(72) Inventors: Marcel Martini, Hanau (DE); Stephan Huber, Rechtmehring (DE); Stefan Meyer, Ronneburg (DE); Hilmar Von Campe, Bad Homburg (DE); Sven Boehme, Niederschoena (DE)

(73) Assignee: FRAUNHOFER-GESELLSCHAFT ZUR FÖRDERUNG DER ANGEWANDTEN FORSCHUNG E.V, Munich (DE)

( * ) Notice: Subject to any disclaimer, the term of this patent is extended or adjusted under 35 U.S.C. 154(b) by 0 days.

(21) Appl. No.: 14/373,951

(22) PCT Filed: Jan. 22, 2013

(86) PCT No.: PCT/EP2013/051143
§ 371 (c)(1),
(2) Date: Jul. 23, 2014

(87) PCT Pub. No.: WO2013/110607
PCT Pub. Date: Aug. 1, 2013

(65) Prior Publication Data
US 2015/0050773 A1     Feb. 19, 2015

(30) Foreign Application Priority Data
Jan. 23, 2012   (DE) .................. 10 2012 100 535

(51) Int. Cl.
*H01L 31/18*     (2006.01)
*H01L 31/0224*   (2006.01)
*H01L 31/05*     (2014.01)

(52) U.S. Cl.
CPC .... *H01L 31/188* (2013.01); *H01L 31/022425* (2013.01); *H01L 31/0512* (2013.01); *Y02E 10/50* (2013.01)

(58) Field of Classification Search
None
See application file for complete search history.

(56) References Cited

U.S. PATENT DOCUMENTS 7,264,991 B1    9/2007  Lin
2008/0076307 A1 3/2008  Nishi et al.
(Continued)

FOREIGN PATENT DOCUMENTS

DE    102009044038 A1    3/2011
DE    102010000520 A1    8/2011
(Continued)

OTHER PUBLICATIONS

International Preliminary Report on Patentablity dated Jul. 29, 2014 for PCT application No. PCT/EP2013/051143.
(Continued)

*Primary Examiner* — Charles Garber
*Assistant Examiner* — Steven Christopher
(74) *Attorney, Agent, or Firm* — Ohlandt, Greeley, Ruggiero & Perle, L.L.P.

(57) ABSTRACT

A method is provided for producing an electrically conductive contact on a rear face and/or front face of a solar cell. The method interconnects solar cells in a cost-effective manner and ensures that cell damage, which leads to a reduction in power, is avoided. The rear face and/or front face of the solar cell is treated in the region of the contact
(Continued)

Figure 2:
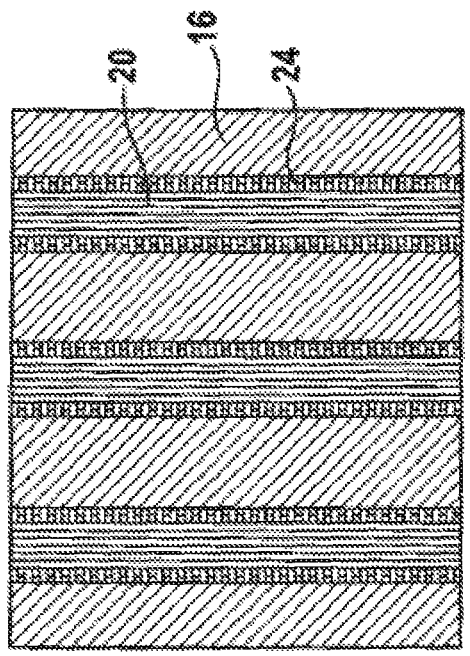

and, after the treatment in the region, a pasty adhesive or an adhesive tape is applied in strips.

22 Claims, 3 Drawing Sheets

(56) References Cited

U.S. PATENT DOCUMENTS

| | | | |
|---|---|---|---|
| 2009/0260758 A1* | 10/2009 | Kosche et al. | 156/275.5 |
| 2010/0116314 A1* | 5/2010 | Fukushima et al. | 136/244 |
| 2010/0233868 A1* | 9/2010 | Maeda et al. | 438/464 |
| 2011/0048492 A1* | 3/2011 | Nishiwaki | 136/244 |
| 2011/0120752 A1* | 5/2011 | Imai et al. | 174/250 |
| 2012/0240995 A1* | 9/2012 | Coakley | H01L 31/0201 136/256 |
| 2012/0255610 A1* | 10/2012 | Bokria et al. | 136/259 |

FOREIGN PATENT DOCUMENTS

| | | |
|---|---|---|
| DE | 102010016814 B3 | 10/2011 |
| EP | 2003699 A2 | 12/2008 |
| EP | 2056355 A1 | 5/2009 |
| JP | H03183527 A | 8/1991 |
| JP | H03188180 A | 8/1991 |
| JP | H0645024 A | 2/1994 |

OTHER PUBLICATIONS

International Search Report dated Apr. 10, 2013 for PCT application No. PCT/EP2013/051143.
Written Opinion dated Apr. 10, 2013 for PCT application No. PCT/EP2013/051143.
English translation of PV Magazine Intersolar 2011, May 31, 2011, Products, Germany, 2 pages.

* cited by examiner

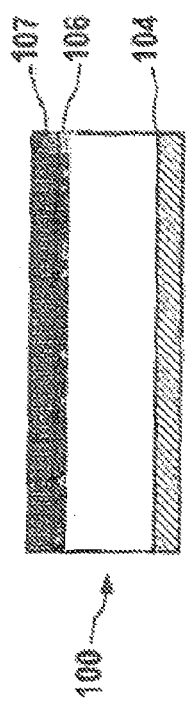
Fig. 4
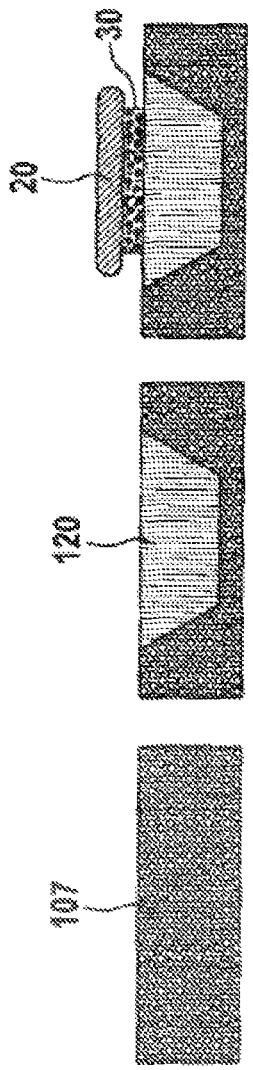
Fig. 5
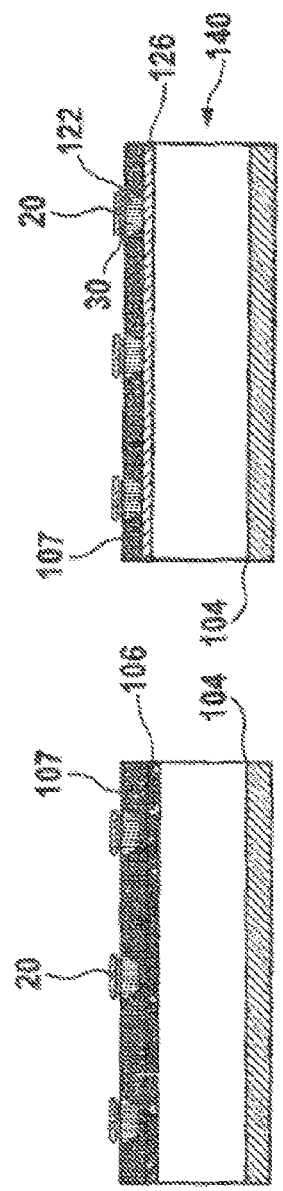
Fig. 6
Fig. 7

METHOD FOR PRODUCING AN ELECTRICALLY CONDUCTIVE CONTACT ON A SOLAR CELL

The invention relates to a method for producing an electrically conductive contact on a rear face and/or front face of a solar cell, wherein the contact is connected to a connector, which interconnects solar cells, by means of an adhesive.

It is known how to connect the busbar of a solar cell to a cell connector in an electrically conductive manner via an electrically conducting adhesive, while maintaining the structure of the solar cell (see INTERSOLAR 2011, May 31, 2011).

An electrically conducting material, containing epoxy resin, phenolic resin, or phenoxy resin, is utilized according to JP-A-03188180 to connect semiconductor components in an electrically conductive manner According to JP-A-03183527, it is known how to arrange a conducting film, which is temporarily melted by ultrasonication, between contacts in order to connect a semiconductor chip to electrodes.

According to JP-A-06045024, an electrically conductive adhesive is used for the electrically conductive connection of LCDs, for example.

US 2008/00776307 A1 relates to a connection between a connector and a solar cell. The connector consists of a conductor and a layer surrounding it—for example, an electrodeposited layer. The connector can be furnished with a conductive adhesive or soldering material in the region in which the contact to the solar cell is produced. Another possibility is to apply an adhesive or a soldering material to the region of the solar cell in which the contact to the connector is to be produced.

An interconnection of solar cells to create a solar cell module is disclosed in EP 2 056 355 A1. For this purpose, a busbar is initially placed on the solar cell and is then coated with an adhesive layer. Afterwards, a connector is applied under pressure with simultaneous subjection to heat, so that the connector partially surrounds the busbar.

A connection method for semiconductor chips is described in U.S. Pat. No. 7,264,991 B1. An electrically conductive adhesive is provided between the semiconductor chip and the connector so as to form a sandwich structure. The adhesive is removed outside of the connection by means of brushing, for example.

The present invention is based on the object of interconnecting solar cells in a cost-effective manner, while simultaneously ensuring that cell damage, which leads to a reduction of power, is avoided. In particular, the occurrence of damage to the adhesive connections, such as, for example, delamination, is to be avoided. A secure connection is to be produced.

In order to achieve this object, it is essentially proposed in accordance with the invention that the surface of the rear face and/or front face is treated in the region in which the contact is to be formed and that, after the treatment, a pasty adhesive material or an adhesive tape is applied in the region or on the region in strips as the adhesive with simultaneous electrically conductive connection in or with the region.

In order to ensure a secure connection between the adhesive in the form of a pasty adhesive material or adhesive tape applied in strips and the rear face and or front face of the solar cell, the latter is subject to pretreatment or treatment. Here, pretreatment or treatment means that consolidation or solidification occurs at least in the region, preferably substantially only in the region, in which the adhesive is applied. The term surface also includes in this case the near-surface region. Consequently, pretreatment does not mean the usual purification or cleaning of contact surfaces prior to application of the adhesive.

Treatment of the surface in the desired regions ensures that the adhesive is bonded to the rear face and/or front face of the solar cell with the requisite adhesion, so that the pull-off forces to which the adhesive can be subjected are such as can otherwise be achieved only when the adhesive—as in the prior art—is bonded to busbars or pads, particularly those made of silver. Due to the teaching of the invention, corresponding busbars and pads are not required for the adhesive, so that cost savings ensue. Furthermore, on account of the adhesive used, soldering is fundamentally not required for electrically conductive bonding to the cell connectors, so that cell damage due to temperatures thereby encountered and any reduction in power associated therewith are avoided.

As the material for the adhesive, in particular, a material is used from the group consisting of phenolic resin, epoxy resin, phenoxy resin, polyurethane, silicone, and acrylate, said material preferably containing electrically conductive particles. However, there is no departure from the invention even if, when the adhesive is applied, it does not contain electrically conductive particles, which, instead, enter it only after it is applied to the rear face and/or front face of the solar cell. This occurs when at least one contact—for example, the rear contact—consists of a rather porous layer, such as an aluminum layer, and the adhesive is forced into the layer structure so as to solidify the porous material. In the process, the electrical conductivity of the contact layer is maintained, while its strength or solidity increases.

At least one action taken from the following group occurs for treatment of the region in which the contact is to be produced: at least partial consolidation in a desired surface region, application of soldering material and/or application of another adhesive to the desired surface region. As a result of these actions, the soldering material or the adhesive penetrates into the surface, resulting in compacting or consolidation. Consolidation can also be achieved mechanically, for example.

Another possibility is to apply a polymer with terminal functional groups. Mentioned by way of example is the application of a silane and thiol with terminal functional groups, such as amino or epoxy groups.

The at least partial consolidation can be carried out by means of ultrasonication, laser irradiation, thermal treatment, and/or mechanical surface treatment. The latter is possible by means of a brush, for example, which accomplishes a smearing/smoothing of the surface, particularly in the case of a crystalline solar cell with a porous rear face made of very ductile material, so that the adhesion of the adhesive is improved.

In particular, it is also provided that a material capable of being soldered or metallically wetted is alloyed into the surface of the rear face, particularly at least one material from the group consisting of Sn, Pb, In, Ga, Cd, Fe, Ag, Au, Ti, Hf, Zn, Mg, Ca, Ba, soldering material, or a mixture of materials of this group.

The regions treated to produce the contact can have a pad or strip shape, without the involvement of busbars or pads, which are used according to the prior art for connecting cell connectors and are made of silver, in particular. Instead, the pad-shaped or strip-shaped regions are created by treatment of the rear face or front face of the solar cell, with preference being given, in particular, to a consolidation of the surface region by means of ultrasonication or laser irradiation.

Regarding the path of the strip-shaped region, it is noted that this region can run parallel or perpendicular to the fingers. The connector connecting the solar cells runs perpendicular to the fingers.

Although a consolidation of a rear face region, in particular, by alloy diffusion of soldering material is known (EP-A-2 003 699), a firmly bonded connection to a cell connector on the corresponding consolidated regions is then accomplished by soldering, as a result of which the temperatures that occur can result in damage to the cell.

A consolidation by means of ultrasonication is also known from DE-B-10 2010 016 814 or DE-A-10 2010 000 520. In this case, soldering material is heated to temperatures of up to 500° C., so that it cannot be ruled out in principle that cell damage occurs.

Based on the teaching of the invention, there are savings that result from dispensing with the silver otherwise required for an electrically conductive connection between cell connectors and a solar cell. Tin-plated or zinc-plated copper strips or aluminum strips can be used as cell connectors, enabling a saving of production costs. Therefore, the invention is also characterized in that there exists the possibility of creating an electrical connection between a solar cell and a cell connector without the use of silver, that is, in a silver-free manner.

A pretreatment of the regions in which cell connectors are to be connected to a solar cell also includes the application of another adhesive material beforehand in order to achieve a largely level adhesive area, this adhesive material sealing the texture on the front face and, in the case of a porous rear face surface, such as an aluminum surface, sealing the pores on the rear face and thus affording a desired level contact surface as the region. As such, the adhesive material also results in a consolidation, particularly by forcing the material into the rear contact, as a result of which solidification of the material occurs.

Therefore, the invention is also characterized in that the surface in the region in which the electrically conductive contact is to be produced is smoothed by means of an adhesive material and that the adhesive with which the connector is subsequently connected is then applied to the adhesive material. However, smoothing can also be carried out by a soldering material.

In particular, the texture can be "leveled" or smoothed on the front face by a soldering material so as prevent the adhesive material or the adhesive from adhering largely to the peak regions of the textured surface.

On the rear face, the surface treatment can occur particularly by local or full-area laser irradiation or by ultrasonication, as is known from DE-A-10 2009 044 038. The alloy diffusion actions according to EP-A-2 003 699 can be applied to the rear face as well, as a result of which the adhesive is then applied directly.

Tin-plating can be carried out additionally during ultrasonication.

The teaching of the invention is not limited to a certain type of solar cell. Preferably, however, crystalline solar cells, such as crystalline silicon solar cells or thin-layer solar cells, are used.

As adhesive tape and/or adhesive applied in strips, in particular, those having a width B with 0.5 mm≤B≤10 mm, in particular 0.8 mm≤B≤2 mm, and/or a thickness D with 3 μm≤D≤50 μm are used. The actual width of the adhesive tape is governed by the width of the connectors.

An adhesive can also be a varnish, in particular a clear varnish. This affords the advantage that the width extension can be greater than that of the cell connector, without the occurrence of any undesired masking in the front face region.

Mentioned as preferred adhesive materials in the adhesive are epoxy resin, phenolic resin, phenoxy resin, polyurethane, silicone, and UV-cured acrylate. In order for the adhesive material to be conductive, a material or a plurality of materials from the group of silver, copper, aluminum, gold, graphite, zinc, tin, and palladium can be chosen as fillers.

If a paste is used as adhesive, the following method steps are preferably employed: After surface treatment of the contact surface of the cell, that is, of the regions in which the connector is to be connected to the solar cell in an electrically conductive manner, the paste is applied. Afterwards, the connector is placed on top with gentle pressure to distribute the paste over the area. Finally, the paste is dried or cured, it being possible to accelerate this process by raising the temperature. The curing should occur in the range between room temperature and 300° C., preferably in the range between 100° C. and 200° C. Exposure to this temperature should occur over a period of 0.5 s to 25 min. However, it is also possible to carry out the curing first in a laminator in which a solar cell module is produced.

If an adhesive tape is used as adhesive, the following actions are to be preferably taken. After surface treatment of the contact surface of the cell, that is, of the region in which the connector is to be contacted, the adhesive tape is applied. Afterwards, the connector is placed on top with slight pressure and at a temperature between room temperature and preferably 70° C. Actions such as those for standard stringers can then occur. Bonding or curing of the adhesive material should occur at a pressure between 0.5 MPa and 4 MPa at a temperature between 100° C. and 200° C. over a period of between 0.5 s and 30 s.

It is noted quite generally that the curing or bonding, that is, the connection between the connector and the adhesive, is also possible by means of ultrasonication.

Further details, advantages, and features of the invention ensue not only from the claims and the features to be taken from them—as such and/or in combination—but also from the following description of the exemplary embodiments to be taken from the drawing.

Figure 1:
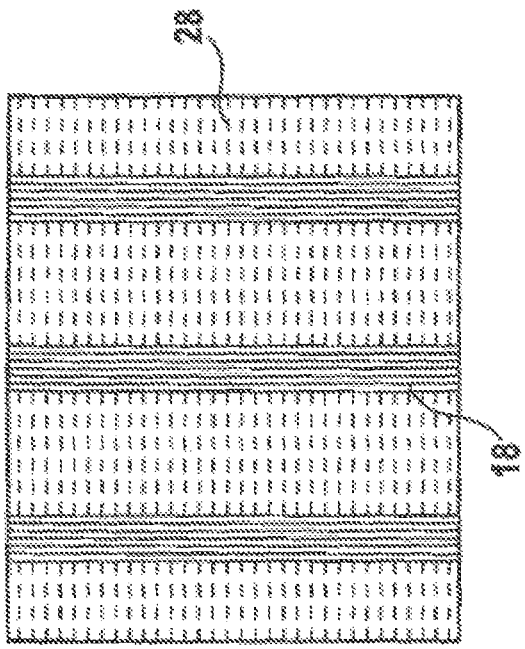
Figure 3:
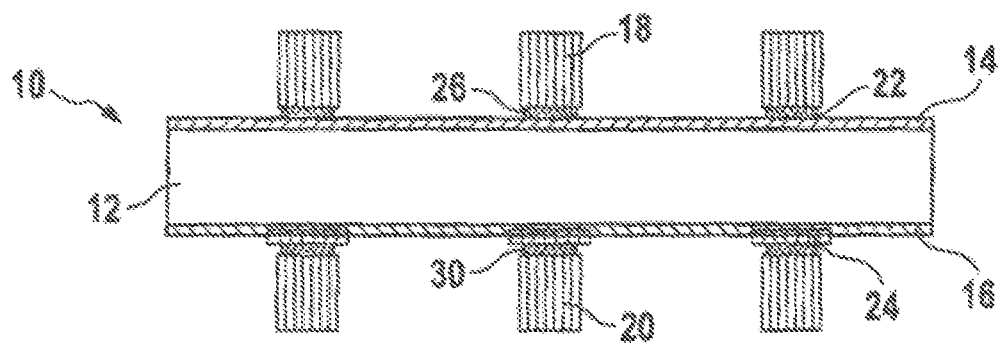

Shown are:

FIG. 1 a plan view of a solar cell,

FIG. 2 a view of the solar cell according to FIG. 1 from the rear face,

FIG. 3 a cross section through the solar cell of FIGS. 1 and 2,

FIG. 4 another schematic illustration of a solar cell,

FIG. 5 a process sequence for producing an electrically conductive connection between a rear face of a solar cell and a connector, and FIG. 6, 7 solar cells with connectors running along their rear faces.

A crystalline silicon solar cell 10 is to be inferred in purely schematic terms from the figures, said solar cell consisting of a p-conducting substrate 12 and comprising a front face metallization 14 as a front contact and a rear face contact 16, which, in particular, is formed as a full-area sintered aluminum layer having a porosity of between 5% and 20% so as to create a back surface field over the entire rear face. In order to interconnect the solar cell 10 with other solar cells, the rear face, that is, the rear face contact 16, and the front face, that is, the front face contact 14, have to be connected to so-called cell connectors 18, 20 in an electrically conductive manner, said connectors connecting adjacent cells to one another. In this case, the cell connector 18 of the solar cell 10 running along the front face extends to the rear face of the next solar cell, for example, and, vice versa, the cell connector 20 running along the rear face extends to the front face of a preceding solar cell and vice versa.

In order for the cell connectors 18, 20 to be connected both to the front face contact 14 and to the rear face contact 16 to the requisite extent and with the required strength or solidity, it is provided according to the invention that the front face contact 14 and/or the rear face contact 16 are/is treated in the contact regions 22, 24 that are to be produced. This can be conducted on the front face particularly by applying strip-shaped solder strips to the front face in the regions in which the cell connectors 18, 20 are to be contacted. Electrically conductive adhesive strips 26 are then applied to the solder strips, to which cell connectors 18 are subsequently connected by adhesion.

As can be seen from FIG. 1, the cell connectors 18 run crosswise to the contact fingers 28, which are illustrated by broken lines, even when they run continuously from edge to edge. In the exemplary embodiment, a total of three cell connectors 18 extend over the contact fingers 28. The function of the contact layer to the cell connectors 18, that is, the busbars, is assumed in this case by the adhesive strips 26 or the soldering material applied beforehand. An additional busbar, such as is necessary according to the prior art and fundamentally is made of silver, is thus dispensed with.

On the rear side, in the regions in which the cell connectors 20 run, the rear face layer 16, which consists particularly of aluminum, is consolidated. This can be produced by purely mechanical treatment, such as, for example, with a brush, as a result of which the porous surface is smoothed and hence a sufficient adhesive surface for adhesive strips 30 is formed.

In particular, however, there occurs a laser irradiation or an ultrasonication, with it being possible, in addition, for an alloy diffusion of material such as soldering material to occur, as is described in EP-A-2 003 699, for example.

Consolidation can occur by laser irradiation, for example, as is disclosed in DE-A-10 2009 044 038. Reference to the relevant disclosures is insofar explicitly made.

An adhesive strip 30, which produces the connection between the region 24 and the cell connector 20, is then applied to each of the appropriately treated strip-shaped regions 24.

The teaching of the invention will be explained in greater detail on the basis of preferred exemplary embodiments.

Further features of the teaching of the invention that are to be highlighted result on the basis of the exemplary embodiments described below.

Illustrated in FIG. 4 is another schematic illustration of a crystalline silicon solar cell 100 having a pn transition 104. The silicon solar cell 100 is imprinted over the entire area of the rear face with a paste made of aluminum. Contact formation of the resulting aluminum layer 107 with the substrate of the solar cell 100 is accomplished by sintering the aluminum layer 107, which can have a thickness between 30 μm and 50 μm. In this process, a eutectic compound Al—Si, which is identified as 106 in FIG. 4, forms in the direct vicinity of the rear face of the substrate of the solar cell 100. The thickness amounts to approximately 5 μm. The remaining region of the aluminum layer 107 thus exhibits a thickness of between 25 μm and 45 μm, depending on how the original thickness of the aluminum layer 107 was designed. The remaining layer consists of a loose sintered composite of aluminum beads and glass frit portions, the solidity of which is not particularly high. If the layer 107 is solidified with a connector, only limited pull-off forces—in particular, ≤N—are achieved, because the pull-off force is governed by the strength or solidity of the substrate.

In accordance with one aspect according to the invention, the layer 107 is solidified by ultrasonic soldering by means of a solder; that is, it is treated. This is accomplished in that the solder penetrates into the pores of the loose sintered aluminum layer 107 and a region 120 (FIG. 5) is formed, which, in comparison to the layer 107, is consolidated outside of the soldered region and hence exhibits a higher solidity. At a soldering temperature of around 250° C., the penetration depth of the soldering material lies between 10 μm and 30 μm. However, it is noted that the penetration depth depends on the predetermined porosity and consistency of the aluminum paste. With increasing soldering temperature, the penetration depth of the solder increases. In this case, it is found that, at a temperature between 350° C. and 400° C., the entire layer 107 is penetrated down to the eutectic 106. As a result of the solidification of the material that thereby occurs, higher pull-off forces can be achieved. The adhesive in the form of the adhesive strip 30 is then applied to the appropriately solidified region 120 in accordance with the schematic illustration of FIG. 5 in order that the connector 20 can then be placed on top in the manner described and connected via the adhesive strip 30 to the region 120 and hence to the rear contact 107 of the solar cell 100 in an electrically conductive manner.

Schematically illustrated in FIG. 6 is the solar cell 100 with the consolidated regions 120 and the connectors 20. It can be seen that the soldering material runs at a spacing to the eutectic 106. Obviously, there is also the possibility, in accordance with the preceding explanations, for the consolidated region 120 to extend to the eutectic 106.

Alternatively, there exists the possibility of infiltrating a liquid adhesive, instead of solder, in order to treat the region that is to be connected to the cell connector in an electrically conductive manner. This can be accomplished at various temperatures, depending on the kind of adhesive. It is possible, for example, to infiltrate a liquid adhesive at room temperature, or 20° C., to approximately 80° C., which then cures owing to the evaporation of solvent. Other adhesives (for example, thermoplastics) become liquid only at higher temperatures. If an appropriate adhesive is infiltrated into the porous aluminum layer 107 of a solar cell 140, a stabilization of the solidity of the corresponding region 122 of the aluminum layer 107 is achieved in the infiltrated region after curing. The curing occurs, for example, by the evaporation of the solvent, cooling in the case of thermoplastics, cross-linking in the case of multicomponent adhesives, or UV curing in the case of UV-cured adhesives. After curing has occurred, the adhesive forms, together with the porous metal layer 107, a solid composite, on which higher pull-off forces than those outside of the composite are achieved. An adhesive, such as the adhesive strip 30, is then placed on the corresponding region 122 in the previously described manner and a connector 20 is then placed on it (FIG. 7).

Another embodiment of the teaching of the invention will be explained on the basis of FIG. 7. The solar cell 140 exhibits the basic structure of the solar cell 100 with the restriction that, on its rear face, it is passivated by a SiN layer or an $Al_2O_3$ layer 126. The corresponding layer 126 is coated in the previously described manner with the screen-printed and sintered aluminum rear contact 107. Consequently, the predominant region of the rear contact consists of the composite of aluminum beads and glass frit portions having low solidity. In order to obtain regions of higher solidity, the previously described infiltration with an adhesive occurs.

Alternatively, a soldering could be carried out. Accordingly, regions 122 are formed that, in comparison to the remaining aluminum layer 107, exhibit a greater solidity.

It can be further provided that the metallic surface is smoothed by mechanical brushing of the surface of the rear contact, with the Al beads lying on the surface, which are very ductile, being flattened by the mechanical deformation and bonded to one another. This leads to an improvement of the contact resistance to the electrically conductive adhesive strip 30 that is to be applied or to the cell or series connector 20 that is to be applied.

If the mechanical consolidation, which occurs by the aforementioned brushing, is possible in addition to the region-by-region consolidation of the aluminum layer 107 by infiltration or soldering, it is then possible, even without appropriate method steps and solely by mechanical processing of the rear face surface of the aluminum layer 107, for consolidation and improvement in the contact resistance to occur to such an extent that a sufficiently electrically conductive connection between the connector and the surface of the aluminum layer 107 occurs via the adhesive, such as a paste or an adhesive strip, while simultaneously achieving the desired, relatively high pull-off forces.

It is not illustrated in FIG. 7 that the layer must have a plurality of openings in order that the electrically conductive contact is produced between the aluminum layer 107 and the substrate 12 of the solar cell 10, 100, 140.

The invention claimed is:

1. A method for producing an electrically conductive contact on a rear face of a solar cell of a plurality of solar cells, the method comprising:
   applying an aluminum layer onto the rear face; sintering the aluminum layer;
   consolidating the sintered aluminum layer having pores to define a region of the contact on the rear face of the solar cell, wherein the region is connected to a connector that interconnects the plurality of solar cells, by at least one process selected from the group consisting of (a) ultrasonic soldering of the region by a solder, wherein the solder penetrates into the pores in the region: (b) infiltrating the region with a first adhesive in liquid and curing the first adhesive in liquid; and (c) mechanical consolidation in the region by smearing or smoothing a surface of the region;
   applying in the region a second pasty adhesive or a second adhesive tape in strips, wherein the second pasty adhesive or the second adhesive tape is electrically conductively connected with the solar cell; and
   connecting the second pasty adhesive or the second adhesive tape to the connector, wherein the region has a width greater than a width of the second pasty adhesive or the second adhesive tape.

2. The method according to claim 1, wherein the second pasty adhesive or second adhesive tape comprises at least one material selected from the group consisting of epoxy resin, phenolic resin, phenoxy resin, polyurethane, silicone, UV-cured acrylate, and combinations thereof.

3. The method according to claim 2, wherein the second pasty adhesive or second adhesive tape is electrically conductive.

4. The method according to claim 1, wherein the step of consolidating comprises partial consolidation of the surface, and wherein the partial consolidation of the surface comprises at least one process selected from the group consisting of laser irradiation, and thermal treatment, and combinations thereof.

5. The method according to claim 1, further comprising brushing the surface prior to application of the second pasty adhesive or second adhesive tape.

6. The method according to claim 1, further comprising alloying a material that can be soldered or metallically wetted into the surface of the solar cell.

7. The method according to claim 6, wherein the material comprises at least one material selected from the group consisting of Sn, Pb, In, Ga, Cd, Fe, Ag, Au, Ti, Hf, Zn, Mg, Ca, Ba, soldering material, and combinations thereof.

8. The method according to claim 1, further comprising:
   using, as the solar cell, a solar cell that has a porous layer as a rear contact over an entire surface of the rear face; and
   forming pad-shaped or strip-shaped regions as the region of the contact to be formed.

9. The method according to claim 1, further comprising:
   using, as the solar cell, a solar cell having bulbar-free front face with current collectors that run roughly parallel to one another; and
   applying the second pasty adhesive or second adhesive tape in strips and running crosswise to the current collectors.

10. The method according to claim 1, further comprising applying a soldering material to the region prior to application of the second pasty adhesive or second adhesive tape.

11. The method according to claim 1, wherein the solar cell is a crystalline solar cell.

12. The method according to claim 1, wherein the solar cell is a crystalline silicon solar cell or a thin-layer solar cell.

13. The method according to claim 1, further comprising connecting the connector to the second pasty adhesive or second adhesive tape in an electrically conductive manner.

14. The method according to claim 13, wherein the connector comprises a material selected from the group consisting of soldered copper, zinc-plated copper, aluminum, and soldered aluminum.

15. The method according to claim 1, wherein the second pasty adhesive or the second adhesive tape is applied onto the region with a width that is greater than or equal to 0.5 mm and less than or equal to 10 mm.

16. The method according to claim 1, wherein the second pasty adhesive or second adhesive tape is applied onto the region with a thickness that is greater than or equal 3 um and less than or equal to 50 μm.

17. The method according to claim 1, further comprising coating the region, before applying the second pasty adhesive or second adhesive tape, with a functional silane.

18. The method according to claim 17, wherein the functional silane comprises ethoxysilane or methoxysilane with another functional amino group or epoxy group.

19. The method according to claim 1, wherein the second pasty adhesive or second adhesive tape comprise an adhesive that contains at least one material selected from the group consisting of silver, copper, nickel, aluminum, gold, graphite, zinc, tin, and palladium.

20. The method according to claim 1, wherein the step of smearing or smoothing a surface of the region comprises smoothing the surface with a third adhesive material.

21. The method according to claim 1, wherein the step of smearing or smoothing is application of soldering material.

22. The method according to claim 1, wherein the second pasty adhesive or the second adhesive tape in strips is connected directly to the region.

* * * * *